United States Patent [19]

Hayashi et al.

[11] 4,108,666
[45] Aug. 22, 1978

[54] MONOFUNCTIONAL MONOMER-CONTAINING PHOTOSENSITIVE COMPOSITION FOR PHOTORESIST

[75] Inventors: Nobuyuki Hayashi; Asao Isobe; Katsushige Tsukada; Toshiaki Ishimaru, all of Hitachi, Japan

[73] Assignee: Hitachi Chemical Co., Ltd., Tokyo, Japan

[21] Appl. No.: 665,883

[22] Filed: Mar. 11, 1976

[30] Foreign Application Priority Data

Apr. 11, 1975 [JP] Japan .................. 50-44719

[51] Int. Cl.² .............................. G03C 1/68
[52] U.S. Cl. .............................. 96/115 P; 96/115 R; 96/35.1; 96/86 P; 204/159.22; 560/90; 560/120; 560/127; 560/199
[58] Field of Search ............... 96/115 R, 35.1, 115 P; 260/47 S, 486 H; 204/159.22

[56] References Cited

U.S. PATENT DOCUMENTS

| | | | |
|---|---|---|---|
| 2,760,863 | 8/1956 | Plambeck, Jr. | 96/35.1 |
| 3,367,992 | 2/1968 | Bearden | 260/837 |
| 3,663,599 | 5/1972 | Koshimura et al. | 260/475 P |

OTHER PUBLICATIONS

Encyclopedia of Polymer Science & Tech. Interscience (1972), pp. 575-576, 588, 595, 604, 607-608.
Chemical Abstracts, pp. 6988, 6989, 8th Coll. Ed.

*Primary Examiner*—John D. Welsh
*Attorney, Agent, or Firm*—Armstrong, Nikaido, Marmelstein & Kubovcik

[57] ABSTRACT

A photosensitive composition for a photoresist, which comprises (A) a compound having the following general formula:

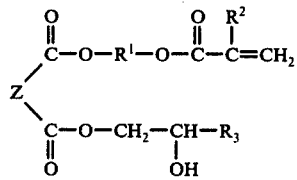

wherein Z is a cyclic dibasic acid anhydride moiety, $R^1$ is an alkylene group having 1 to 3 carbon atoms, $R^2$ is hydrogen or methyl, and $R^3$ is hydrogen, methyl, ethyl or $-CH_2X$ in which X is chlorine or bromine, (B) a photopolymerization sensitizer, (C) a polymer being capable of giving a film-forming property, (D) a chain transfer agent and (E) a thermal polymerization inhibitor; and a laminated photosensitive element which has a substantially dry photosensitive layer of the photosensitive composition. The composition and element are capable of giving a minute resist pattern which is excellent as an etching resist or metal plating resist and can be readily removed after etching or metal plating.

14 Claims, 1 Drawing Figure

MONOFUNCTIONAL MONOMER-CONTAINING PHOTOSENSITIVE COMPOSITION FOR PHOTORESIST

BACKGROUND OF THE INVENTION

The present invention relates to a novel photosensitive composition and a novel laminated photosensitive element suitable for making a resist for etching or metal plating which is employed, for example, in preparing a printed circuit or in precisely processing a metal article.

In preparing a printed circuit, a resist is employed in an etching or metal plating step. The precision of the resist defines the precision of the etching or metal plating work. When a precise etching or metal plating work is required, a photoresist process being capable of giving a precise resist is employed.

The etching or metal plating employing a photoresist is usually carried out according to the following manner:

(I) A photoresist layer is provided on a surface of a base to be etched or metal plated. The photoresist layer is formed by applying a photosensitive composition solution to the base and drying the obtained coating, or by laminating a so-called non-solvent type photoresist film, which is preformed from the photosensitive composition, to the base.

(II) The photoresist formed on the base is exposed to light through a mask. The exposed areas are thereby hardened and become insoluble in a solvent for the composition.

(III) The unexposed areas are removed by employing a solvent therefor. Conventionally, the procedure is called "development" and the solvent employed is called the "developer".

(IV) The resultant unmasked areas on the base are modified by etching or metal plating.

The main properties required for the photoresist employed in such a process are as follow:

(I) The photoresist should be solid. When a photoresist is exposed to light through a mask, a liquid photoresist is inconvenient to handle and requires a specific exposure device. When a photoresist is formed by applying a photosensitive composition solution to a base, it is required that the photosensitive composition be a solid after drying even though it may be liquid in applying. When a photoresist is formed by laminating a preformed non-solvent type resist film to a base, it is required that the resist film be readily laminated to the base, i.e., that it have good adherence to the base. Since the resist film is laminated with heat and pressure, it is required to have a heat-adhesiveness.

(II) The photoresist should have a good developing property. The solubility of the photoresist to a developer should be remarkably changed by exposure to light. That is to say, it is required that the exposed areas become insoluble in the developer and the unexposed areas remain readily soluble in the developer.

(III) The photoresist should have a good resisting property. The photoresist should protect the masked areas of the base during etching or metal plating. It is required that the photoresist have good adherence to the base as well as good chemical and electrical strengths.

(IV) The photoresist should be readily stripped. The resist is removed after etching or metal plating. Accordingly, the resist should be capable of being readily stripped from the base.

The photosensitive materials employed for preparing the photoresist which are presently sold on the market and employed are classified into the following two groups:

(A) Photocrosslinkable polymer, (B) A combination of polyfunctional vinyl monomer and unreactive polymer being capable of giving a film-forming property A representative example of group (A) is polyvinyl cinnamate. This polymer has been employed as a photosensitive material for preparing a photoresist for the longest time. The preparation of a photoresist employing the polymer is carried out only by applying its solution onto a base. A method of employing a preformed non-solvent type photoresist film has not been practiced with the polymer. In order to produce a uniform thick photosensitive layer having no pin-holes, it is necessary for the thickness of the layer to be more than 15 $\mu$ under the present technique in the art. However, a photosensitive layer of polyvinyl cinnamate having a thickness of more than 15 $\mu$ cannot be employed because of its low photocrosslinkability, i.e. its low photosensitivity. To the contrary, polymers having an acryloyl group in their side chain are highly photosensitive since their photocrosslinking reaction is radical chain reaction. Accordingly, it seems possible to form a photoresist by employing a preformed non-solvent type photoresist film made of these polymers since there is little limitation relating to the thickness of the photosensitive layer. However, this method has not been practiced because there are probably some problems in the stability of the preformed photoresist film on storage.

In the case of group (B), photocrosslinkability of the polyfunctional vinyl monomer is utilized. Since the photocrosslinking reaction of the polyfunctional vinyl monomer is a radical chain reaction, there is little limitation relating to the thickness of the photosensitive layer. The group (B) photosensitive materials are mainly employed for preparing a preformed non-solvent type photoresist film.

In the case of classifying photoresists, a photoresist produced by employing a photosensitive system containing as the photosensitive material the above-mentioned polyvinyl cinnamate or a polymer having an azide group in its side chain wherein the crosslinking of the polymer is caused by nitrene generated by photolysis of the azide group is generally called a "photocrosslinking type resist", and a photoresist produced by employing a photosensitive system containing a polyfunctional vinyl monomer as the photosensitive material is called a "photopolymerization type resist", taking notice of the utilization of the radical chain photopolymerization reaction of the vinyl group. A photoresist employing the above-mentioned polymer having an acryloyl group in its side chain is classified into the latter, since the polymer is crosslinked but the crosslinking is caused by the radical photopolymerization reaction. The fact that the photoresist is called a photopolymerization type resist does not mean that crosslinking of the polymer does not take place. In other words, a photoresist utilizing the photosensitive system wherein crosslinking takes place but the crosslinking is caused by radical photopolymerization is called a photopolymerization type resist.

It is known that there are various problems with respect to the known photoresists described above. Of these problems, the problem which is desired to be overcome most urgently relates to the stripping property of the photoresist. The known photoresists cause various problems because of the difficulty in stripping them after etching or metal plating.

The problems associated with the stripping of the photoresists formed by employing the conventional photosensitive compositions are as follows:

(1) It is required to employ strong solvents or reagents for stripping the resists. Usually, methylene dichloride or a mixture containing methylene dichloride as the main ingredient together with formic acid and/or methanol is employed. It is difficult to strip the known photoresists by means of 1,1,2-trichloroethylene (trichlene) which is employed in the preparation of a silk screen printing plate. There are two serious problems in the use of methylene dichloride as compared to the use of trichlene. The first is that an etched or metal plated base per se is sometimes damaged in preparing a printed circuit since methylene dichloride is a strong solvent and has a strong permeability. The second is the high volatility of methylene dichloride. Methylene dichloride ruins the working environment since it is very volatile at a normal temperatures. It is difficult to mechanize the stripping operation according to a process of spraying a stripping liquid and circulating it because of the high volatility. It is difficult to obtain a stripping device wherein the escape of methylene dichloride is sufficiently prevented.

(2) Various problems associated with the fact that the known photoresists are stripped swelling-wise. The resist is not completely soluble in the stripping liquid and the stripping thereof is caused mainly by its swelling. Accordingly, in order to remove the resist completely, it is necessary to employ the stripping liquid in combination with a mechanical means such as brushing. However, it is difficult to completely remove a resist having a minute pattern according to this method. Particularly, it is impossible to remove a resist formed on a base that cannot resist the mechanical impact caused by brushing. Since the resist is not dissolved into the stripping liquid but is merely swelled thereby, the debris of the resist stripped is present in the stripping in this manner liquid in a form of particles or membranes. The debris in the stripping liquid causes, in many cases, clogging of spray nozzles or filter media. This defect is another reason why it is difficult to mechanize the operation stripping. There is also a problem of the debris of the resist adhering to the base. Particularly, the debris is liable to adhere to through holes, and it is difficult to remove the debris.

(3) The use of methylene dichloride is economically unfavorable since methylene dichloride per se is more expensive than trichlene and is lost in large amounts during the stripping operation due to its high volatility.

The above-mentioned problems encountered in stripping the known photoresists are substantial problems which are attributable to the photoresists per se. That is to say, since the conventional photoresist technique utilizes a photocrosslinking reaction in order to form a resist pattern corresponding to a mask in a developing step, it is substantially impossible to avoid the above-mentioned difficulties in the stripping operation. However, it is not believed that the photocrosslinking reaction is fundamentally essential for the purpose of forming a resist pattern by utilizing the difference between the solubilities of exposed areas and unexposed areas with respect to a developer in the pattern forming, or developing step. For instance, the use of a monofunctional vinyl monomer instead of a polyfunctional vinyl monomer may be considered. It would be expected that the monofunctional vinyl monomer would be polymerized by photopolymerization to give a polymer which is less soluble than the monomer. In fact, there has been proposed a monofunctional vinyl monomer-photosensitive system even though the purpose thereof is different from that of a photoresist. However, the use of such a photosensitive system for preparing a photoresist is not known. From the historical point of view, the polyfunctional vinyl monomer-photosensitive system has been developed and practiced for the purpose of improving the monofunctional vinyl monomer-photosensitive system (for instance, see Takahiro Tsunoda, "Kankosei Jushi", pages 45 to 50, 121 to 122, and 124; Takashi Tsunoda, "Shikizai", 44(1971), page 68; and U.S. Pat. No. 2,875,047, column 5, lines 15 to 21).

In U.S. Pat. No. 2,760,863, L. Plambeck et al mention the use of compounds having one or more vinyl groups in preparing a printing relief. In the working examples of the patent, however, all photosensitive composition systems employed contain compounds having not less than two vinyl groups and compounds having one vinyl group, and, even though employed, the compounds having one vinyl group are not employed alone but are employed in combination with the compounds having not less than two vinyl groups for the purpose of modifying them. As is clear from the above-mentioned publications, it is generally understood that the achievement of Plambeck et al is to have proposed the polyfunctional vinyl monomer-photosensitive system for the improvement of the monofunctional vinyl monomer-photosensitive system. In Celeste, British Pat. No. 1,275,471, there is exemplified a monofunctional vinyl monomer-photosensitive system which can be employed for a resist. However, the monofunctional vinyl monomer employed in the system is merely employed for the purpose of modification as described in the Plambeck et al patent and the system is photocrosslinked.

From the present inventors' research, it has been determined also that it is impossible to obtain a practical photoresist by employing the photosensitive system which utilizes utilizing only the photopolymerization of a monofunctional vinyl monomer. A first problem is that there does not really exist any monofunctional vinyl monomer having a non-volatility such that only solvents in a resist solution containing the vinyl monomer are selectively removed when a coating of the resist solution is dried to give a solid resist layer. Furthermore, even if a resist containing a volatile monofunctional vinyl monomer as a reactive component is formed, the vinyl monomer would volatilize from the resist with lapse of time. For instance, in the case of a photosensitive system containing N-butoxymethyl acrylamide, which belongs to the group of monomers having the highest boiling points among the known monofunctional vinyl monomers, and acetone, which has a low boiling point as an ordinary solvent, it is difficult to selectively remove only acetone from the coating thereof by drying and it is impossible to control the amount of the monomer remaining in the obtained resist within a desired range after drying. Even a monomer which does not cause the first problem encounters a second problem. This is poor compatibility of the monomer with other components. For instance, monomers such as acrylamide gradually crystallize in the resist and are finally separated out. In the case of N-butoxymethyl acrylamide mentioned above and polypropylene glycol monomethyl ether monomethacrylate, there is no polymer capable of giving a film-forming property which is compatible with them. Accordingly, these monomers migrate onto the surface of the resist with lapse of time and are finally separated out. It is impossible to obtain a photosensitive system suitable for giving a preformed non-solvent type photoresist film for which stability on storage is strongly required, by utilizing conventional monofunctional vinyl monomers in view of the volatility and compatibility problems mentioned above. A third problem is the developer-resistance of the resist. In the resists obtained by employing known monofunctional vinyl monomers, a great difference between the solubilities of the exposed areas and unexposed areas to a developer is not obtained. As a result a faithful resist pattern cannot be obtained. The reasons therefor are that about 12 to about 20% by weight of the monofunctional vinyl monomer (based upon the weight of the resist remains unreacted in the resist) after exposure and that the solubility of the polymer formed by exposure is not much different from that of the original monomer. A fourth problem is the resist property of the resist. The resist obtained from a photosensitive system containing a monofunctional vinyl monomer has a low resistance against etching or a metal plating operation since the resist contains a great amount of unreacted monomer after exposure.

Heretofore, a photosensitive system composed of monofunctional vinyl monomer and polymer capable of giving a film-forming property that does not cause the problems mentioned above has not been known. In the abovementioned U.S. Pat. No. 2,760,863, there are disclosed a variety of monofunctional vinyl monomers (see column 17, line 50, to column 18, line 11). However, the first, second, third and fourth problems mentioned above cannot be avoided with the monomers recited in the patent, not even with styrene which is exemplified as the most preferred example. Even from the viewpoint of only the first and second problems, the recited monomers are unfavorable for giving a preformed non-solvent type photoresist film because of difficulty in the preparation of the film and low stability of the film on storage. Accordingly, these monomers are merely employed as a modifier of the polyfunctional vinyl monomers or an an auxiliary as described in the examples of the patent.

As described above, it is impossible to obtain a photoresist having a superior stripping property according to the prior art.

OBJECTS OF THE INVENTION

It is an object of the present invention to provide a novel photosensitive composition capable of giving a minute resist pattern which is excellent as an etching or metal plating resist in the preparation of a printed circuit or in the precise working of a metal article, and which can be readily removed after etching or metal plating.

Another object of the invention is to provide a novel laminated photosensitive element capable of giving a minute resist pattern which is excellent as an etching or metal plating resist in the preparation of a printed circuit or in the precise working of a metal article, and can be readily removed after etching or metal plating.

These and other objects of the invention will become apparent from the description hereinafter.

DETAILED DESCRIPTION

Figure 1:
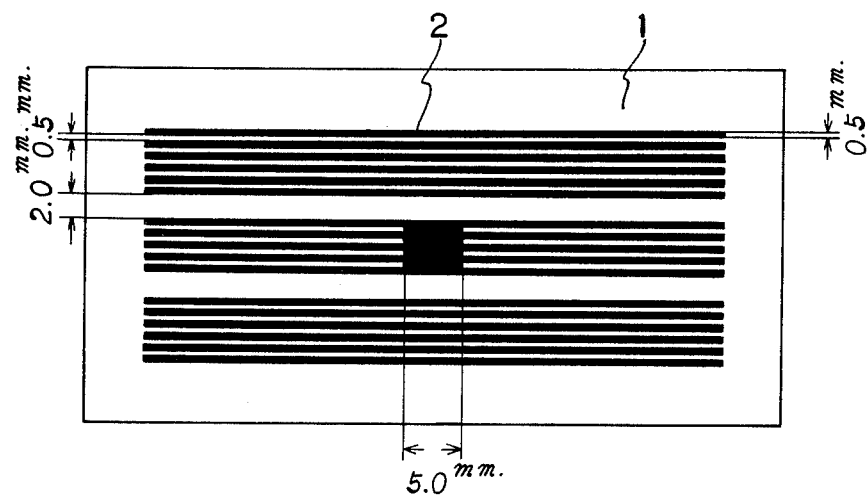
FIG. 1 shows a negative mask employed in the Examples of the present invention.

It was now been determined according to the present invention that the above-mentioned objects are readily accomplished by a photosensitive composition containing as main ingredients: (A) a compound having the following general formula:

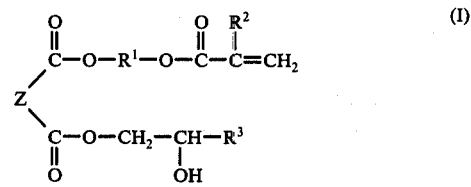

wherein Z is a cyclic dibasic acid anhydride moiety, $R^1$ is an alkylene group having 1 to 3 carbon atoms, $R^2$ is hydrogen or methyl, and $R^3$ is hydrogen, methyl, ethyl or $-CH_2X$ in which X is chlorine or bromine; (B) a photopolymerization sensitizer; (C) a polymer capable of giving a film-forming property; (D) a chain transfer agent and (E) a thermal polymerization inhibitor.

The first characteristic of the photosensitive composition of the present invention is that it contains as the photopolymerizable material a specified monofunctional vinyl monomer, i.e., a compound having only one photopolymerizable ethylenically unsaturated group as represented by the general formula (I).

The compound having the general formula (I) is readily prepared from a starting cyclic dibasic acid anhydride according to the following reaction schemes:

Reaction Scheme (A)

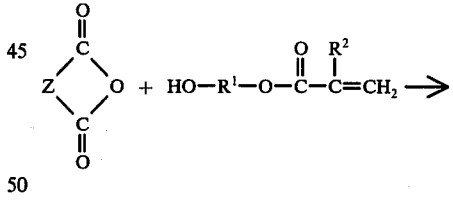

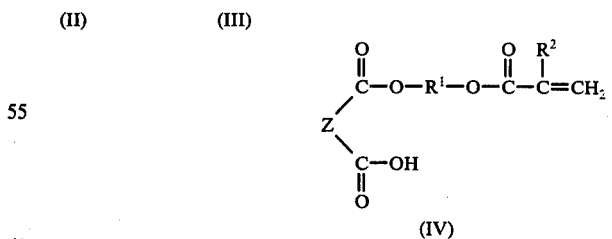

Reaction Scheme (B)

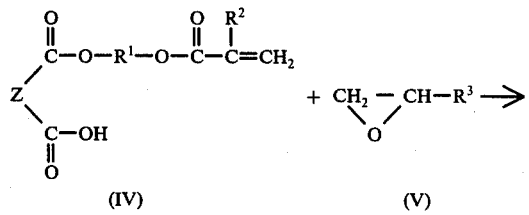

-continued

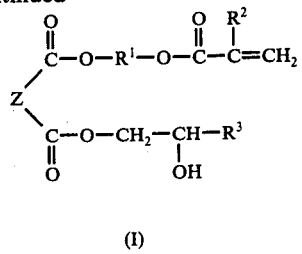

(I)

In the reaction schemes, Z, $R^1$, $R^2$ and $R^3$ are the same as defined above.

Examples of the cyclic dibasic acid anhydrides (II) include succinic anhydride, phthalic anhydride, hexahydrophthalic anhydride, tetrahydrophthalic anhydride, Himic anhydride (commercial name of 3,6-endomethylene-1,2,3,6-tetrahydrophthalic anhydride made by Hitachi Chemical Company, Ltd.) and Methylhimic anhydride (commercial name of 4- or 5-methyl-3,6-endomethylene-1,2,3,6-tetrahydrophthalic anhydride made by Hitachi Chemical Company, Ltd.). Examples of the dihydric alcohol (meth)acrylates (III) include hydroxymethyl acrylate, β-hydroxyethyl acrylate, β-hydroxypropyl acrylate, γ-hydroxypropyl acrylate, hydroxymethyl methacrylate, β-hydroxyethyl methacrylate, β-hydroxypropyl methacrylate and γ-hydroxypropyl methacrylate. Examples of the 1,2-epoxides (V) include ethylene oxide, propylene oxide, 1,2-butylene oxide, epichlorohydrin and epibromohydrin.

The reaction shown by the reaction scheme (A) is preferably carried out by agitating a cyclic dibasic acid anhydride (II) and a dihydric alcohol (meth)acrylate (III) in the presence of a solvent such as benzene, toluene, or the like, or in the absence of the solvent in the presence of a thermal polymerization inhibitor such as phenol derivative at 50° to 120° C. for several hours; usually, 1 to 3 hours. The reaction shown by the reaction scheme (B) is preferably carried out by agitating a compound (IV) obtained in the preceding reaction and an epoxide (V) which is usually employed in excess, in the presence of a tertiary amine or quaternary ammonium salt at 50° to 120° C. for several hours, usually, 1 to 3 hours, and distilling off excess epoxide and, if employed, the solvent.

The preferred examples of compounds having the general formula (I) are compounds wherein $R^3$ is —CH$_2$X, such as β-vinylcarboxyethyl γ-chloro-β-hydroxypropyl phthalate ($R^1$=ethylene, $R^2$=hydrogen, and $R^3$=-CH$_2$Cl).

All of the compounds having the general formula (I) are viscous liquids having boiling points of higher than 100° C./2mmHg. Therefore, the solvent is selectively removed from a photoresist solution containing the compound. Further, these compounds are compatible with the polymers capable of giving a film-forming property mentioned below. The non-solvent type photoresist film obtained from a resist solution containing the compound has good adhesion to a base to be etched or metal plated, good photosensitivity and good resist property after long periods of time since the compound incorporated in the film is not lost by volatilization under normal conditions and the film maintains an appropriate adhesion adhesion. The polymer obtained from the compound having the general formula (I) by photopolymerization has a good developer-resistance. The compound having the general formula (I) does not have as bad an influence on the resist property of the photoresist as the conventional monofunctional vinyl monomers even though a small amount thereof remains unreacted in the photoresist, since the compound per se has better resistance to an etching liquid or metal plating liquid and better adhesion to a base than the conventional monofunctional vinyl monomers. These effects of the compounds having the general formula (I) may be attributed to the fact that the compounds have a polar hydroxy group. The effects are further improved in the case of the compounds in which $R^3$ is —CH$_2$X.

The second characteristic of the photosensitive composition of the present invention is the chain transfer agent (D). Since the photosensitive composition of the present invention contains only the compound (I) as the photopolymerizable material, only photopolymerization occurs with exposure and the polymer formed in the resist is a non-crosslinked linear polymer. Accordingly, the polymer would be expected to be soluble in a stripping liquid and the resist pattern would be expected to be readily removed. However, it has been found that only when the photosensitive composition contains a chain transfer agent, can the formed polymer be dissolved into a stripping liquid. The reason therefor is deemed to be that, in the photosensitive composition lacking a chain transfer agent, chain transfer of the polymer radicals formed during the photopolymerization of the compound (I) occurs with the polymer giving the film-forming property incorporated in the composition or with the formed polymer to give a crosslinked polymer. The chain transfer agent is capable of suppressing such an unfavorable crosslinking reaction. The chain transfer agent to be employed in the present invention is a so-called chain transfer agent for radical chain polymerization. A preferred chain transfer agent has a large chain transfer constant, Kx, particularly, of more than 10 liters/mole.sec. (to polymethyl methacrylate radical at 60° C.). A chain transfer agent having a small chain transfer constant is not favorable since it must be employed in a large amount, which results in disadvantages such as a lowering of the photosensitivity and film property of the obtained photoresist layer and the resist property of the obtained resist pattern.

The preferred examples of the chain transfer agent include halogen compounds such as carbon tetrabromide, hexabromoethane, tetrabromoethylene, pentabromoethane and bromo-trichloromethane, and sulfur compounds such as lauryl mercaptan, α-thioglycerol, octyl thioglycolate, diphenyl disulfide and thiuram disulfide.

The photopolymerization sensitizers (B) employed in the present invention include anthraquinones such as 2-ethylanthraquinone or 2-tert-butylanthraquinone, acyloins such as benzoin and its alkyl ether derivatives, benzophenones such as benzophenone and Michler's ketone, and ketaldonyl compounds such as benzil and diacetyl.

The polymers capable of giving a film-forming property (C) include homopolymers and copolymers of vinyl monomers such as acryl monomers such as alkyl esters of acrylic acid and methacrylic acid, and copolymers of these monomers and other monomers such as styrene or vinyl acetate. The preferred polymers are copolymers of acryl monomers and monomers having a carboxyl or hydroxyl group such as acrylic acid, methacrylic acid, maleic acid or β-hydroxyethyl (meth)acrylate, since they improve the adhesion of the obtained resist layer to a base. Particularly, when employing polymers containing a large amount of monomer units having a carboxyl or hydroxyl group, it is possible to employ an aqueous solvent as the developer or stripping liquid for the obtained resist. Preferably, the polymers have a molecular weight of from ten to fifty thousand.

The thermal polymerization inhibitors (E) to be employed in the present invention include phenol derivatives such as hydroquinone, hydroquinone monomethyl ether, p-methoxyphenol and 2,2-methylenebis(4-methyl-6-tert-butylphenol).

The photosensitive composition of the present invention preferably contains the above-mentioned ingredients (A), (B), (C), (D) and (E) in ranges of 10% to 60% by weight, 1% to 10% by weight, 20% to 80% by weight, 0.1% to 5% by weight and 0.1% to 5% by weight, respectively, on the basis of the total amount of the ingredients. The amounts of the ingredients are determined based on considerations such as, mainly, the film-forming property, adhesiveness, photosensitivity and stability over a period of time of the composition; the developing property and stripping property of the resist layer obtained from the composition; and, in the case the composition is made into a preformed non-solvent type photoresist film, the adhesiveness to a base and ease of lamination of the resist film. The ingredient (A) is employed in a proportion of not less than 10% by weight from the viewpoint of the adhesiveness to a base and photosensitivity of the composition or the ease of lamination of the resist film. If the proportion of the ingredient (A) is less than 10% by weight, the adhesiveness of the composition is too low and the difference between the solubilities of exposed areas and unexposed areas of the resist layer to a developer is too small. When the proportion of the composition (A) is more than 60% by weight, it is difficult to make the composition into a film owing to a high adhesiveness and the resist layer after exposure is not readily dissolved into a stripping liquid.

As to the ingredient (B), it is necessary to employ it in a proportion of not less than 1% by weight from the viewpoint of photosensitivity. The use of the ingredient (B) in a proportion of more than 10% by weight is unfavorable since the photosensitivity of the composition is not further improved and there occur undesirable phenomena such as separation of the ingredient (B) out of the composition.

The ingredient (C) should be employed in a proportion of 20% by weight to 80% by weight from the viewpoint of the film-forming property and adhesiveness of the composition.

The proportion of the ingredient (D) varies widely depending upon the kind of each compound employed. The ingredient (D) should be employed in a proportion of not less than 0.1% by weight from the viewpoint of the stripping property of the resist layer and not more than 5% by weight from the viewpoint of the photosensitivity of the composition.

The ingredient (E) should be employed in a proportion of not less than 0.1% by weight from the viewpoint of the stability of the composition. In case the proportion of the ingredient (E) is less than 0.1% by weight, it is impossible to prevent the thermal polymerization of the composition. When the proportion of the ingredient (E) is more than 5% by weight, the photosensitivity of the composition is badly influenced. In consideration of the foregoing, the photosensitive composition of the present invention more preferably contains the ingredients (A), (B), (C), (D) and (E) in a range of 15% to 50% by weight, 1.5% to 5.0% by weight, 40% to 80% by weight, 1.0% to 4.0% by weight and 0.1% to 2.0% by weight, respectively, on the basis of the total amounts of the ingredients.

In the photosensitive composition of the present invention, there may be incorporated auxiliaries such as plasticizers including dioctyl phthalate and triethylene glycol diacetate, and fillers including finely divided calcium silicate. These auxiliaries are employed for controlling the film-forming property of the composition. The photosensitive composition may further contain a dye or pigment such as Methylene Blue, Crystal Violet, Victoria Pure Blue or Phthalocyanine Blue. The choice of the auxiliaries is determined under the same considerations as those of conventional photosensitive compositions.

The photosensitive composition of the present invention is usually employed in the form of a solvent solution of the ingredients (A), (B), (C), (D) and (E), and, if required, the above-mentioned auxiliaries. Preferable solvents include acetone, benzene, toluene, methyl cellosolve, ethyl cellosolve, and the like, and mixtures thereof.

For forming a photoresist layer on a base to be etched or metal plated by employing the present photosensitive composition, any known process in the prior art is applicable. Such processes include a process of directly coating a base with the composition and drying the coating to give a photoresist layer on the base, and a process of coating a separate support with the composition and drying the coating to give a laminated photosensitive element having a substantially dry photosensitive layer on the support and laminating the photosensitive layer to a base.

The descriptions hereinafter will be mainly applicable to the laminated photosensitive element.

The laminated photosensitive element of the present invention can be prepared according to a conventional method in the art by using the abovementioned specific photosensitive composition. The photosensitive composition is coated onto a flexible support and dried so as to give a substantially dry photosensitive layer. The thickness of the photosensitive layer is usually selected to be within a range of about 10 $\mu$ to about 100 $\mu$. A photosensitive layer having a thickness of less than about 10 $\mu$ cannot be obtained without pin-holes. A photosensitive layer having a thickness of more than about 100 $\mu$ has a poor photosensitivity and resolving power. A protective film may be laminated onto the photosensitive layer. Preferable supports are chosen from a wide variety of transparent films composed of polymers such as polyamides, polyimides, polyolefines, polyesters and cellulose esters and have a thickness of about 4 $\mu$ to about 50 $\mu$. Among these films, a polyethylene terephthalate film is the most preferable since it has superior transparency, thermal resistance, solvent resistance and mechanical strength. Preferred protective films are chosen from the films employed as the support film and have a thickness within the same range as the support film. A polyethylene film is most preferable since it can be readily laminated to the photosensitive layer due to its appropriate softness.

To provide a photosensitive layer, i.e., a photoresist layer, on the base to be etched or metal plated by employing the laminated photosensitive element, the protective film, if employed, is stripped from the element and the photosensitive layer of the element is laminated under heat and pressure to the surface of the base together with the supporting film by means of hot rolls.

After being laminated to the base, the photoresist layer is exposed to ultraviolet radiation through the support film thereon and through a mask. Ultraviolet radiations of 300 to 400 mμ are employed for exposure. Suitable light sources include high pressure mercury arc lamps, an ultra-high pressure mercury lamps and carbon arc lamps. The conditions for exposure vary depending upon the kind of the light source employed. In the case of an ultra-high pressure mercury lamp having a power of 3 kW., an exposure of 20 seconds to 20 minutes at a distance of 70 cm. is usually sufficient.

After exposure, the remaining support film is peeled off and the exposed resist layer is developed by removing the unexposed areas thereof by means of a solvent to give a resist pattern on the base. The development is usually carried out by spraying a solvent such as 1,1,1-trichloroethane or trichlene onto the exposed resist layer. The conditions for development should be chosen so as not to dissolve away the exposed areas. 1,1,1-Trichloroethane is preferable because of the ease in the choice of conditions for development. Usually, the development can be readily carried out under a spray pressure of 2 kg./cm.$^2$ for a period of 20 to 200 seconds.

The resist pattern obtained on the base according to the foregoing procedures is sufficiently applicable to an usual etching or metal plating operation. The resist pattern may be further subjected to a heat treatment in order to improve its adhesion to the base, which treatment is not necessary in the normal case. A heat treatment at 80° to 130° C. for 5 to 60 minutes is sufficient. Even when the resist pattern is heat-treated, the ease in removing the resist pattern from the base after etching or metal plating which is the main object of the present invention can be achieved.

After etching or metal plating, the resist pattern is removed from the etched or metal plated base. The removal of the resist pattern is carried out by spraying a solvent such as trichlene or methylene dichloride, which is conventionally employed as a stripping liquid, or by dipping in such a solvent. Other solvents such as acetone and methyl ethyl ketone can, of course, be employed as the stripping liquid. The resist pattern obtained by employing the photosensitive composition of the present invention is readily removed by dissolution in such stripping liquids. Accordingly, it is not essential to employ mechanical means such as brushing in combination with the stripping liquid (as is essential in the case of the conventional photoresist). The resist pattern obtained by employing the photosensitive composition of the present invention can be removed by means of an automatic stripping device which sprays trichlene and which cannot be applied to the conventional photocrosslinkable photoresist. In employing the stripping device, problems such as the clogging of the filter which is employed in circuit for recycling and reproducing the stripping liquid do not occur, and there is almost no necessity for changing the filter medium, as would be the case with the conventional photoresist. Accordingly, in the step of removing the resist pattern obtained according to the present invention, the working environment is greatly improved and the time required for the step is greatly reduced, as compared to the operation for stripping a resist pattern obtained from the conventional photoresist by dipping in the conventional stripping liquid containing methylene dichloride as the main ingredient.

The present invention is more particularly described in the following Examples which are intended to be illustrative only since numerous modifications and variations therein will be apparent to those skilled in the art.

Reference Example 1

In a flask were added 148 g. of phthalic anhydride, 118 g. of 2-hydroxyethyl acrylate and 0.27 g. of 2,2'-methylenebis(4-ethyl-6-tert-butylphenol) and the mixture was agitated at 100° ± 5° C. for about 2 hours. After cooling, 139 g. of epichlorohydrin and 0.49 g. of benzyltrimethylammonium chloride were added thereto and the mixture was agitated at 102° ± 5° C. for about 5 hours. After cooling, the excess epichlorohydrin was distilled off at 50° to 60° C. under a reduced pressure to give a compound having the following formula:

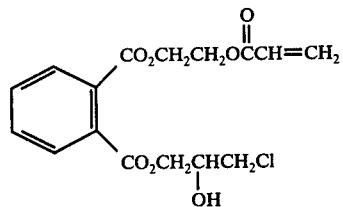

Reference Example 2

The same procedures as in Reference Example 1, except that 154 g. of hexahydrophthalic anhydride and 133 g. of 2-hydroxyethyl methacrylate were employed instead of phthalic anhydride and 2-hydroxyethyl acrylate, respectively, were repeated to give a compound having the following formula:

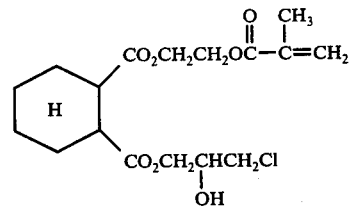

Reference Example 3

In a flask were added 148 g. of phthalic anhydride, 118 g. of 2-hydroxyethyl acrylate and 0.27 g. of 2,2-methylenebis(4-ethyl-6-tert-butylphenol) and the mixture was agitated at 100° ± 5° C. for about 2 hours. After cooling, the mixture was transferred into an autoclave and 87 g. of propylene oxide and 0.42 g. of benzyltrimethylammonium chloride were added thereto. The mixture was then agitated at 102° ± 5° C. for about 5 hours. After cooling, the excess propylene oxide was distilled off at 30° to 40° C. under a reduced pressure to give a compound having the following formula:

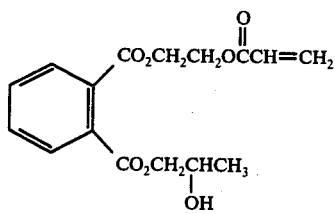

Reference Example 4

The same procedures as in Reference Example 3, except that 154 g. of hexahydrophthalic anhydride, 133 g. of 3-hydroxypropyl acrylate and 108 g. of butylene oxide were employed instead of phthalic anhydride, 2-hydroxyethyl acrylate and propylene oxide, respectively, were repeated to give a compound having the following formula:

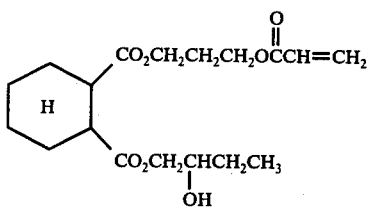

Reference Example 5

The same procedures as in Reference Example 1, except that 178 g. of Methylhimic anhydride and 133 g. of 2-hydroxyethyl methacrylate were employed instead of phthalic anhydride and 2-hydroxyethyl acrylate, respectively, were repeated to give a compound having the following formula:

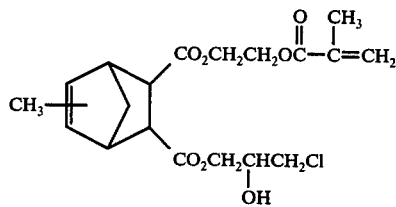

Reference Example 6

The same procedures as in Reference Example 1, except that 100 g. of succinic anhydride and 133 g. of 2-hydroxyethyl methacrylate were employed instead of phthalic anhydride and 2-hydroxyethyl acrylate, respectively, were repeated to give a compound having the following formula:

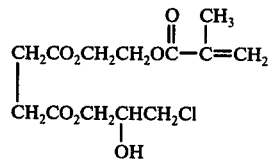

EXAMPLE 1

A. Preparation of Laminated Photosensitive Element

A photosensitive composition solution consisting of the following ingredients was prepared.

| Ingredient | Parts by weight |
| --- | --- |
| Compound obtained in Reference Example 1 | 33 |
| Polymethyl methacrylate (molecular weight: about 80,000)(Note) | 57 |
| Benzophenone | 2.5 |
| Michler's ketone | 0.5 |
| Dioctyl phthalate | 5 |
| Carbon tetrabromide | 2 |
| 2,2'-Methylenebis(4-ethyl-6-tert-butylphenol) | 0.4 |
| Crystal Violet | 0.1 |
| Methyl ethyl ketone | 120 |

(Note) The polymer was prepared according to a solution polymerization employing azobisisobutyronitrile as a polymerization initiator and a polymerization temperature of 70° to 100° C. As the solvent for polymerization, the main solvent employed for the preparation of the photosensitive composition solution was employed. Accordingly, the formed polymer was not isolated after polymerization and the obtained polymer solution was employed as it is for the preparation of the photosensitive composition solution. However, the amount of the polymer shown in the above Table is the amount of the polymer per se. This is also held for Examples hereinafter.

The solution was coated onto a 25 μ thick polyethylene terephthalate film and dried at 80° C. for 5 minutes to give a photoresist layer having a thickness of 25 μ. A 30 μ thick polyethylene film was then laminated under pressure to the photoresist layer to give a laminated photosensitive element.

B. Preparation of Printed Circuit Plate (1) Formation of resist pattern

The copper surface of a copper clad board having a copper layer having a thickness of 60 μ was polished and then treated with an aqueous solution of hydrochloric acid.

After washing with water, it was dried at 80° C. for 20 minutes. While the polyethylene film was peeled off of the laminated photosensitive element obtained in the step A, the bared photoresist layer with the polyethylene terephthalate film was placed on the copper clad board with the surface of the photoresist layer in contact with the copper surface and passed through two rolls of 110° C., during which the photoresist layer was laminated to the copper surface. After being cooled to room temperature, the photoresist layer laminated to the copper clad board was then exposed through a negative mask according to a conventional vacuum printing method. The exposure was carried out for 60 seconds at a distance of 90 cm. by an ultra-high pressure mercury arc lamp having a power of 3 kW. After exposure, the board was allowed to stand for 20 minutes and the remaining polyethylene terephthalate film was peeled off. The exposed photoresist layer was developed by spraying 1,1,1-trichloroethane under a spray pressure of 2 kg./cm.² and washed with water to give a resist pattern corresponding to the negative mask on the copper surface.

The above procedures were repeated except that a copper clad board having a copper layer having a thickness of 35 μ was employed to give a copper clad board bearing the resist pattern.

(2) Etching Treatment

The 60 μ thick copper clad board bearing the resist pattern obtained in (1) was etched with an aqueous solution of ferric chloride according to the conventional method. During etching, the copper layer was etched only in the areas not covered by the resist pattern. Even after etching, the resist pattern was not peeled in a stripping test employing a cellophane tape.

(3) Metal Plating Treatment

The 35 μ thick copper clad board bearing the resist pattern obtained in (1) was heated at 100° C. for 30 minutes. After the heat treatment, the copper layer was electropolished and treated with surfuric acid. The copper layer was then electroplated with copper pyrophosphate and, in succession, with lead-tin solder to give a copper plating layer having a thickness of 35 μ and a solder plating layer having a thickness of 10 μ on the copper layer. During plating, underplating did not occur. Even after plating, the resist pattern was not peeled in the stripping test employing a cellophane tape.

(4) Stripping Treatment

The etched board and the plated board were dipped into trichlene. The resist pattern on the etched board and the resist pattern on the plated board were thereby dissolved away within 20 seconds and within 2 minutes, respectively, without the aid of any further treatment. The plated board from which the resist pattern was removed was further etched with an aqueous solution of ammonium persulfate.

Thus, there were obtained a printed circuit plate having a copper circuit and a printed circuit plate having a copper-solder circuit.

Comparative Example 1

A photosensitive composition solution consisting of the following ingredients was prepared.

| Ingredient | Parts by weight |
| --- | --- |
| Pentaerythritol triacrylate | 35 |
| Polymethyl methacrylate (molecular weight: about 80,000) | 60 |
| 2-Tert-butylanthraquinone | 2 |
| Crystal Violet | 0.2 |
| Hydroquinone | 0.2 |
| Methyl ethyl ketone | 120 |

Employing the solution, the same procedures as in Example 1, A, and B, (1), (2) and (3) were repeated to give an etched copper clad board and a metal plated copper clad board. In the step (3), however, the heat treatment before metal plating was omitted.

Then, the boards were subjected to the stripping of the remaining resist pattern. However, the resist pattern was not removed by dipping into trichlene as in Example 1. It was removed with difficulty by the aid of a vigorous brushing. In that case, however, some part of the circuit pattern was damaged. Particularly, in the case of the metal plated board, it was impossible to remove a minute pattern (for instance, a line having a width of less than 100 μ and circle having a diameter of less than 100 μ) without damaging the circuit pattern. The resist pattern was removed with less difficulty by employing methylene chloride as a stripping liquid, the use of which is undesirable since it is more volatile than trichlene and the working is spoiled. However, even in the case of methylene dichloride, the removal of the resist pattern was not attributable to dissolution but to swelling. Accordingly, the removal of such a minute pattern as mentioned above required the aid of brushing.

EXAMPLE 2

A photosensitive composition consisting of the following ingredients was prepared.

| Ingredient | Parts by weight |
| --- | --- |
| Compound obtained in Reference Example 2 | 60 |
| Copolymer of methyl methacrylate and 2-hydroxyethyl methacrylate (98/2 by weight, molecular weight: about 120,000) | 30 |
| 2-Ethylanthraquinone | 3 |
| Triethylene glycol diacetate | 3 |
| Lauryl mercaptan | 0.5 |
| Hydroquinone monomethyl ether | 0.6 |
| Victoria Pure Blue | 0.2 |
| Benztriazole | 0.05 |
| Methyl ethyl ketone | 80 |
| Toluene | 20 |

Employing the solution, the same procedures as in Example 1A were repeated to give a laminated photosensitive element having a photoresist layer sandwiched by the polyethylene terephthalate film and the polyethylene film. Of the element, the photoresist layer with polyethylene terephthalate film was laminated to both sides of a Kovar (iron-nickel-cobalt alloy made by Westinghouse Electric Corp.) sheet having a thickness of 0.4 mm., exposed and then developed. The negative mask for exposure had a pattern as shown in FIG. 1. In FIG. 1, the pattern is drawn on a scale of one to two, and 1 and 2 show transparent areas and opaque areas, respectively. After development, the Kovar sheet bearing a resist pattern was etched by showering an aqueous solution of ferric chloride. The Kovar sheet was thereby etched only in the areas not covered by the resist pattern to give a minute pattern of Kovar corresponding to the negative mask. During etching, the resist pattern was not peeled. After etching, the resist pattern was removed by spraying a mixture of trichlene and ethanol (80/20 by weight) of 40° C. for a period of one minute. The bared Kovar pattern was then electroplated with gold according to a conventional method to give a gold plating layer having a thickness of 3 μ on the whole surface of the Kovar pattern, which showed that the resist pattern had been removed completely in the preceding step.

Comparative Example 2

Employing the laminated photosensitive element obtained in Comparative Example 1, the same procedures as in Example 2 were repeated. During etching, the resist pattern was liable to peel. This defect was improved by heat-treating the resist pattern at 100° C. for 20 minutes prior to etching. However, the heat treatment lowered the stripping property of the resist pattern, which resulted in the requirement of the aid of brushing. Accordingly, the resist pattern could not be removed completely without damaging the minute pattern of Kovar.

EXAMPLES 3 TO 6

Employing the photosensitive composition solutions shown in Table 1, the same procedures as in Example 1 were repeated. The results thereof are shown in Table 2.

tractor for an hour. The extracting ratio was determined. The results thereof are shown in Table 3.

Table 1

| Example 3 | | Example 4 | |
|---|---|---|---|
| Ingredient | Parts by weight | Ingredient | Parts by weight |
| Compound obtained in Reference Example 3 | 20 | Compound obtained in Reference Example 4 | 25 |
| Polymethyl methacrylate (molecular weight: about 100,000) | 65 | Copolymer of methyl methacrylate and ethyl acrylate (97/3 by weight: about 90,000) | 65 |
| Benzoin ethyl ether | 5 | 2-Tert-butylanthraquinone | 3 |
| Triethylene glycol diacetate | 8 | Adekasaizar-K-2 (plasticizer made by Adeka Argus Chemical Co., Ltd.) | 5 |
| Pentabromoethane | 0.5 | α-Thioglycerol | 0.1 |
| p-Methoxyphenol | 0.5 | 2,2'-Methylenebis(4-methyl-6-tert-butylphenol) | 0.6 |
| Crystal Violet | 0.2 | Victoria Pure Blue | 0.1 |
| Methyl ethyl ketone | 20 | Methyl ethyl ketone | 120 |
| Ethyl cellosolve | 60 | | |
| Toluene | 20 | | |

| Example 5 | | Example 6 | |
|---|---|---|---|
| Ingredient | Parts by weight | Ingredient | Parts by weight |
| Compound obtained in Reference Example 5 | 40 | Compound obtained in Reference Example 6 | 16 |
| Polymethyl methacrylate (molecular weight: about 50,000) | 50 | Copolymer of methyl methacrylate and methyl acrylate (89/11 by weight, molecular weight: about 90,000) | 74 |
| Benzophenone | 2 | Benzophenone | 2.5 |
| Michler's ketone | 0.3 | Michler's ketone | 0.5 |
| | | Triethylene glycol diacetate | 9 |
| Octyl thioglycolate | 0.5 | Carbon tetrabromide | 2 |
| Hydroquinone | 0.02 | Hydroquinone monomethyl ether | 0.5 |
| Oplass Blue-IIN (commercial name, made by Kabushiki Kaisha Morishita Shoten) | 0.05 | Crystal Violet | 0.2 |
| Methyl ethyl ketone | 20 | Methyl ethyl ketone | 105 |
| Methyl cellosolve | 120 | | |

Table 2

| | Example 3 | Example 4 | Example 5 | Example 6 |
|---|---|---|---|---|
| Etching resistance | Good | Good | Good | Good |
| Plating resistance | Good | Good | Good | Good |
| Stripping property | | | | |
| Etched base | Dissolved into trichlene within 1 minute | Dissolved into trichlene within 2 minutes | Dissolved into methylene dichloride within 1 minute | Dissolved into trichlene within 1 minute |
| Plated base | Dissolved into trichlene within 3 minutes | Dissolved into trichlene within 5 minutes | Dissolved into methylene dichloride within 5 minutes | Dissolved into trichlene within 2 minuted |

EXAMPLE 7

Each of the laminated photosensitive elements obtained in Examples 1 to 6 and Comparative Example 1 was exposed in a whole surface of the photoresist layer for 60 seconds at a distance of 90 cm. by the same lamp as employed in Example 1. The resist layer was taken out and then extracted with trichlene in a Soxhlet extractor for an hour. The extracting ratio was determined. The results thereof are shown in Table 3.

Each of the laminated photosensitive elements obtained in Examples 1 to 6 and Comparative Example 1 was exposed in the same manner as in the above and then heattreated at 100° C. for 30 minutes. The resist layer was taken out and then extracted in the same manner as in the above. The results thereof are also shown in Table 3.

Table 3

| | | Extracting ratio of resist layer (% by weight) | | | | | | |
|---|---|---|---|---|---|---|---|---|
| Resist layer | | Example 1 | Example 2 | Example 3 | Example 4 | Example 5 | Example 6 | Comparative Example 1 |
| Treatment | Exposure | 100 | 99 | 100 | 100 | 98 | 100 | 68 |
| | Exposure and heat-treatment | 99 | 98 | 100 | 98 | 96 | 100 | 64 |

As shown in Table 3, the resist layer obtained according to the present invention is soluble in trichlene after exposure or exposure plus heat-treatment and no photocrosslinking substantially occurs, differing from the conventional photocrosslinkable resist composed of a polyfunctional vinyl monomer as shown in Comparative Example 1.

Comparative Example 3

The same procedure as in Example 1, except that the photosensitive composition lacking only carbon tetrabromide was employed, was repeated. The etching resistance and plating resistance of the resist pattern were good. In removing both resist patterns on the etched base and the plated base, however, they were not removed completely with trichlene, methylene dichloride or acetone and a thin stratum thereof remained undissolved. The residual stratum was removed with difficulty by brushing with a cleanser.

Comparative Example 4

A photosensitive composition solution consisting of the following ingredients was prepared.

| Ingredient | Parts by weight |
|---|---|
| N-butoxymethyl acrylamide | 40 |
| Polymethyl methacrylate (molecular weight: about 100,000) | 50 |
| Benzophenone | 2.5 |
| Michler's ketone | 0.5 |
| Triethylene glycol diacetate | 6 |
| Hydroquinone | 0.3 |
| Victoria Pure Blue | 0.15 |
| Methyl ethyl ketone | 100 |

The solution was coated onto a 25 μ thick polyethylene terephthalate film and dried at 90° C. for 5 minutes. During drying, the waste gas from the dryer was bad-smelling and the fact that a great amount of N-butoxymethyl acrylamide escaped together with methyl ethyl ketone was observed. Immediately after drying, a 30 μ thick polyethylene film was laminated under pressure to the photoresist layer to give a laminated photosensitive element. The element was immediately laminated to the copper clad board, exposed and developed in the same manner as in Example 1. After a heat treatment at 100° C. for 30 minutes, the copper clad board bearing a resist pattern was subjected to an electroplating with copper pyrophosphate and, in succession, an electroplating with a lead-tin solder in the same manner as in Example 1. In the step of copper plating, underplating occurred on the boundary line of the resist pattern. In the step of solder plating, the solder plating layer on the whole boundary line of the resist pattern was peeled. Therefore, it was absolutely impossible to obtain a sufficient printed circuit. The remaining resist pattern after plating was also peeled by a cellophane tape.

A laminated photosensitive element separately prepared in the same manner as in the above was allowed to stand at 25° C. After a lapse of three days, a great amount of N-butoxymethyl acrylamide was separated out onto the intersurface of the photoresist layer and the polyethylene film. As a result, the element could not be employed for use in forming a photoresist layer on a base.

Comparative Examples 5 and 6

The same procedures as in Comparative Example 4 were repeated except that lauryl methacrylate (Comparative Example 5) or polypropylene glycol monomethyl ether monomethacrylate (number of propylene units: 9) Comparative Example 6) were employed instead of N-butoxymethyl methacrylate. In both cases, there occurred the same defects as observed in Comparative Example 4, i.e., the escape of the monomer together with the solvent during drying, the separating out of the monomer during storage and the inferior plating resistance.

The photosensitive composition and laminated photosensitive element of the present invention will bring great benefits to persons employing them in the manufacture of printed circuits and the precise working of metal articles in which etching or metal plating operations are required. Heretofore, these operations have been troubled by the difficulty in removing the resist pattern. Furthermore, these persons strongly desire to correct such problems as the economical one relating to the fact that methylene dichloride conventionally employed as a stripping liquid is expensive and is lost in large amounts in the stripping step due to its high volatility and the problem relating to pollution of the working environment caused by employing methylene dichloride having a high volatility and serious toxicity. In order to correct the problems relating to the poor economy and toxicity of the stripping liquid per se, there has been proposed a non-solvent type photoresist film capable of giving a resist which is removable with an alkaline aqueous solution. However, in the case of employing an alkaline aqueous solution as the stripping liquid, the recovery and reuse thereof are difficult, differing from the case of employing an organic stripping liquid, and the stripping liquid employed, therefore, must be discarded. Accordingly, the alkaline aqueous stripping liquid is inferior to the organic stripping liquid from an economic aspect. For this reason, the utilization of such a photoresist film has not been widespread. Of course, the resist obtained from this new type photoresist film is also removed swelling-wise, and the difficulty in removing the resist is the same as that in removing the resist obtained from the conventonal photoresist which is removable with an organic stripping liquid. Particularly, it is almost impossible to remove a minute resist pattern since the etched or plated base is damaged, and the possibility of producing inferior articles is extremely high. According to the present invention, all of the problems mentioned above can be settled completely.

What we claim is:

1. A photosensitive composition for a photoresist which comprises (A) a compound having the following general formula:

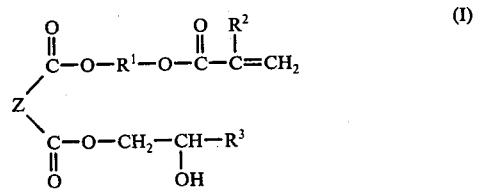

wherein Z is a cyclic dibasic acid anhydride moiety, $R^1$ is an alkylene group having 1 to 3 carbon atoms, $R^2$ is hydrogen or methyl, and $R^3$ is hydrogen, methyl, ethyl or —$CH_2X$ in which X is chlorine or bromine, (B) a photopolymerization sensitizer, (C) a polymer capable of giving a film-forming property, (D) a chain transfer agent having a chain transfer constant of more than 10 liters/mole.sec. to polymethyl methacrylate radical at 60° C and (E) a thermal polymerization inhibitor.

2. The photosensitive composition of claim 1, wherein the ingredients (A), (B), (C), (D) and (E) are in the range of 10% to 60% by weight, 1% to 10% by weight, 20% to 80% by weight, 0.1% to 5% by weight and 0.1% to 5% by weight, respectively, based on of the total amount of the ingredients (A), (B), (C), (D) and (E).

3. The photosensitive composition of claim 1, wherein the ingredients (A), (B), (C), (D) and (E) are in the range of 15% to 50% by weight, 1.5% to 5.0% by weight, 40% to 80% by weight, 1.0% to 4.0% by weight and 0.1% to 2.0% by weight, respectively, based on of the total amount of the ingredients (A), (B), (C), (D) and (E).

4. The photosensitive composition of claim 1, wherein the compound having the general formula (I) is one in which Z is a cyclic dibasic acid anhydride moiety selected from the group consisting of the cyclic dibasic acid anhydride moieties of succinic anhydride, phthalic anhydride, hexahydrophthalic anhydride, tetrahydrophthalic anhydride, 3,6-endomethylene-1,2,3,6-tetrahydrophthalic anhydride and 4- or 5-methyl-3,6-endomethylene-1,2,3,6-tetrahydrophthalic anhydride.

5. The photosensitive composition of claim 1, wherein the compound having the general formula (I) is one in which $R^3$ is —$CH_2X$.

6. The photosensitive composition of claim 1, wherein the chain transfer agent is selected from the group consisting of carbon tetrabromide, hexabromoethane, tetrabromoethylene, pentabromoethane and bromo-trichloromethane.

7. The photosensitive composition of claim 1, wherein the chain transfer agent is selected from the group consisting of lauryl mercaptan, α-thioglycerol, octyl thioglycolate, diphenyl disulfide and thiuram disulfide.

8. A laminated photosensitive element for a photoresist which comprises a flexible support and a substantially dry photosensitive layer thereon comprising (A) a compound having the following general formula:

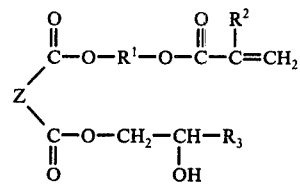

wherein Z is a cyclic dibasic acid anhydride moiety, $R^1$ is an alkylene group having 1 to 3 carbon atoms, $R^2$ is hydrogen or methyl, and $R^3$ is hydrogen, methyl, ethyl or —$CH_2X$ in which X is chlorine or bromine, (B) a photopolymerization sensitizer, (C) a polymer capable of giving a film-forming property, (D) a chain transfer agent and (E) a thermal polymerization inhibitor.

9. The laminated photosensitive element of claim 8, wherein the flexible support is a polyethylene terephthalate film.

10. The laminated photosensitive element of claim 8, wherein on the photosensitive layer is provided a protective film.

11. The laminated photosensitive element of claim 10, wherein the protective film is a polyethylene film.

12. The laminated photosensitive element of claim 8, wherein the photosensitive layer has a thickness of 10 to 100 μ.

13. The photosensitive composition of claim 1, wherein the photopolymerization sensitizer (B) is selected from the group consisting of 2-ethylanthraquinone; 2-tert-butylanthraquinone; benzoin and its alkyl ether derivatives; benzophenone; Michler's ketone; benzil and diacetyl; and the thermal polymerization inhibitor (E) is selected from the group consisting of hydroquinone; hydroquinone monomethyl ether; p-methoxyphenol and 2,2-methylenebis(4-methyl-6-tert-butylphenol).

14. The photosensitive composition of claim 13, wherein the chain transfer agent is selected from the group consisting of carbon tetrabromide, hexabromoethane; tetrabromethylene; pentabromoethane; bromotrichloromethane; lauryl mercaptan; α-thioglycerol; octyl thioglycolate, diphenyl disulfide and thiuram disulfide.

* * * * *